United States Patent
Zerbe et al.

(10) Patent No.: US 7,949,041 B2
(45) Date of Patent: May 24, 2011

(54) METHODS AND CIRCUITS FOR ASYMMETRIC DISTRIBUTION OF CHANNEL EQUALIZATION BETWEEN DEVICES

(75) Inventors: Jared L. Zerbe, Woodside, CA (US); Fariborz Assaderaghi, Los Altos, CA (US); Brian S. Leibowitz, San Francisco, CA (US); Hae-Chang Lee, Los Altos, CA (US); Jihong Ren, Sunnyvale, CA (US); Qi Lin, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 83 days.

(21) Appl. No.: 12/517,274

(22) PCT Filed: Dec. 5, 2007

(86) PCT No.: PCT/US2007/024948
§ 371 (c)(1),
(2), (4) Date: Sep. 4, 2009

(87) PCT Pub. No.: WO2008/070138
PCT Pub. Date: Jun. 12, 2008

(65) Prior Publication Data
US 2010/0046600 A1 Feb. 25, 2010

Related U.S. Application Data

(60) Provisional application No. 60/873,089, filed on Dec. 5, 2006.

(51) Int. Cl.
*H03H 7/30* (2006.01)
(52) U.S. Cl. .................................... 375/233; 375/221

(58) Field of Classification Search .............. 375/233, 375/321, 219, 222, 211, 220, 221
See application file for complete search history.

(56) References Cited

U.S. PATENT DOCUMENTS

| | | | |
|---|---|---|---|
| 4,969,162 A | 11/1990 | Karr | |
| 5,912,920 A | 6/1999 | Marchok et al. | |
| 6,031,866 A | 2/2000 | Oler et al. | |
| 6,307,893 B1 | 10/2001 | Bremer et al. | |
| 6,741,643 B1 | 5/2004 | McGibney | |
| 6,904,110 B2 | 6/2005 | Trans et al. | |
| 7,023,963 B1 * | 4/2006 | Chu et al. | 379/15.05 |
| 7,242,868 B2 * | 7/2007 | Soto et al. | 398/72 |
| 2002/0024996 A1 | 2/2002 | Agazzi et al. | |

(Continued)

OTHER PUBLICATIONS

Fox, T.W. et al., "Transmit and Receive Digital Filters Subject to Hardware Cost Contstraints." Department of Electrical and Computer Engineering University of Calgary, Calgary, Alberta, Canada. IEEE 2002. pp. 1055-1059.

(Continued)

*Primary Examiner* — Emmanuel Bayard
(74) *Attorney, Agent, or Firm* — Silicon Edge Law Group LLP; Arthur J. Behiel

(57) ABSTRACT

A transceiver architecture supports high-speed communication over a signal lane that extends between a high-performance integrated circuit (IC) and one or more relatively low-performance ICs employing less sophisticated transmitters and receivers. The architecture compensates for performance asymmetry between ICs communicating over a bidirectional lane by instantiating relatively complex transmit and receive equalization circuitry on the higher-performance side of the lane. Both the transmit and receive equalization filter coefficients in the higher-performance IC may be adaptively updated based upon the signal response at the receiver of the higher-performance IC.

51 Claims, 9 Drawing Sheets

U.S. PATENT DOCUMENTS

2005/0111585 A1  5/2005  Stojanovic et al.
2005/0169362 A1* 8/2005  Schenk .......................... 375/234

OTHER PUBLICATIONS

Der, Lawrence et al., "A 2GHz CMOS Image-Reject Receiver with Sign-Sign LMS Calibration." Electrical Engineering Department, Univeristy of California, Los Angeles, CA. IEEE, 2001 International Solid-State Circuits Conference. 3 pages.

PCT/US2007/024948 International Search Report and Written Opinion. Mailed Jan. 8, 2009. 22 pages.

Gibbard, Mark R. et al., "Asymmetiric Signal Processing for Indoor Wireles LAN's." IEEE Transaction on Vehicular Technology, vol. 48, No. 6, Nov. 1999. pp. 2053-2064.

From: Lyons, R.G., "Understanding Digital Signal Processing." (Appendix F—pp. 494-505). Copyright 1997 by Addison Wesley Longman Inc. 9 pages.

"Eye diagram Measurements in Advanced Design System." Agilent Technologies. 40 pages, May 26, 2006.

Feng, Le et al., "A Sub-Optimal Receiving Scheme for SCCC with Coded MSK Over ISI Channels." CCECE 2003-CCGEI 2003. Montreal May 2003 IEEE. pp. 77-80.

Oler, Kevin Scott, "Asymmetric Design Feedback Equalization." A Thesis submitted to the faculty of graduate studies in partial fulfullment of the requirement for the degree of Master of Science. Department of Electical and Computer Engineering. Calgary, Alberta. Aug. 1996. 141 pages.

* cited by examiner

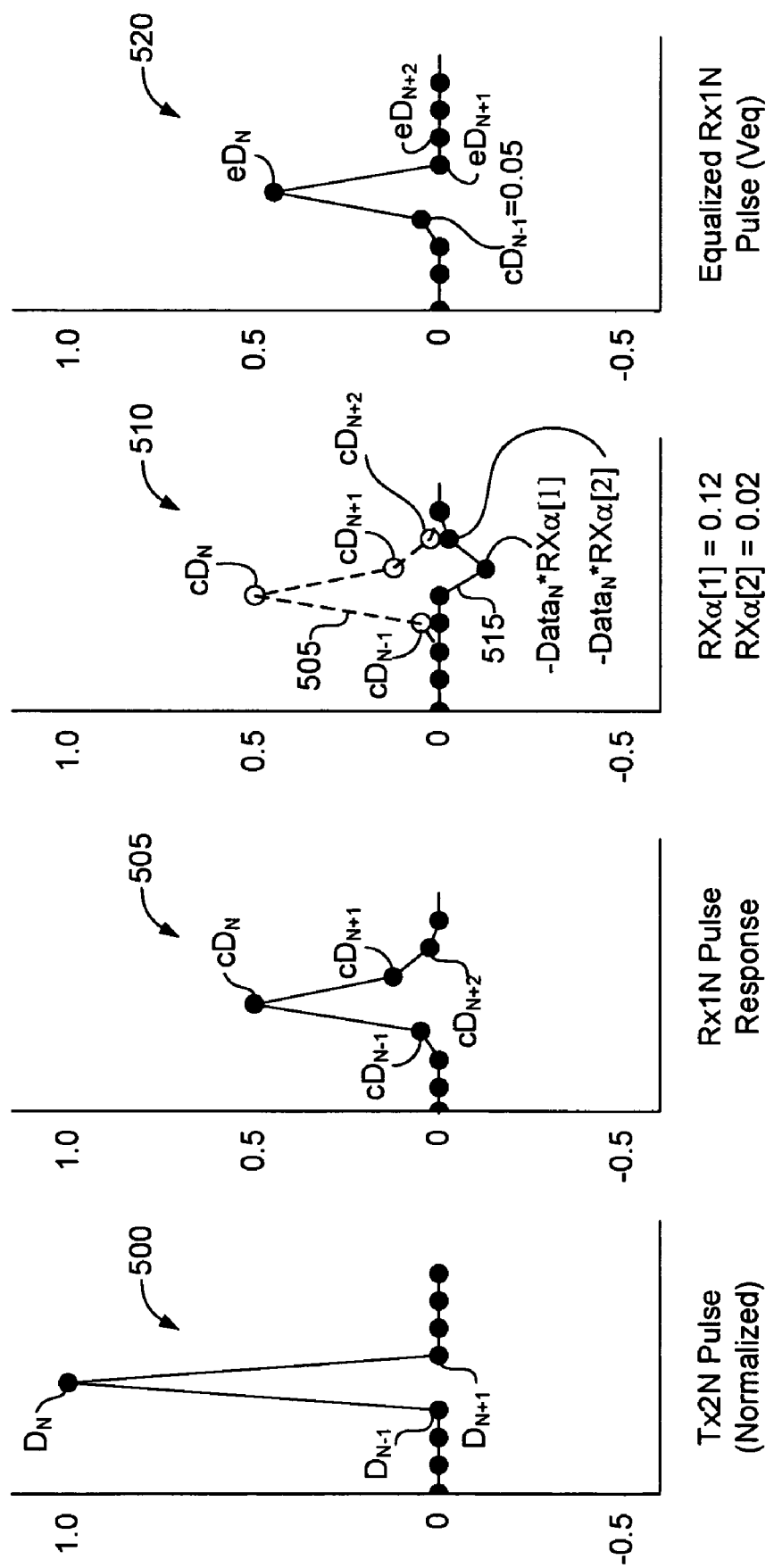

METHODS AND CIRCUITS FOR ASYMMETRIC DISTRIBUTION OF CHANNEL EQUALIZATION BETWEEN DEVICES

FIELD OF THE INVENTION

The present invention relates generally to the field of communications, and more particularly to high speed electronic signaling within and between integrated circuit devices.

BACKGROUND

The performance of many digital systems is limited by the interconnection bandwidth within and between integrated circuit devices (ICs). High performance communication channels between ICs suffer from many effects that degrade signals. Primary among them are frequency dependent channel loss (dispersion) and reflections from impedance discontinuities, both of which lead to inter-symbol interference (ISI). Attempts to address these effects have employed various equalization schemes at the transmitter and receiver. Ideally, transmit and receive equalization work together to mitigate the degradation imposed by the channel, and thus allow increased data rates and/or reduced probability of communication errors.

In some systems, memory systems for example, the communicating ICs have an asymmetry to them that complicates optimization of the transmit and receive equalization schemes applied to counter the effects of the corresponding channel. For example, a memory controller that communicates with one or more memory devices may benefit from a fabrication technology that is different from that best suited for manufacturing the memory devices. It is therefore often the case that a memory controller can employ circuitry that exhibits significantly higher performance in speed and power than that of the associated memory device or devices. This process performance asymmetry between the communicating ICs complicates the task of optimizing equalization between the two types of devices.

BRIEF DESCRIPTION OF THE DRAWINGS

The subject matter disclosed is illustrated by way of example, and not by way of limitation, in the figures of the accompanying drawings and in which like reference numerals refer to similar elements and in which:

FIGS. 5A through 5D are hypothetical waveform diagrams used in connection with FIGS. 3 and 4A to illustrate the process of applying appropriate receive coefficients RXα[2: 1] to DFE 325 to correct for ISI introduced over channel 125.

DETAILED DESCRIPTION

Figure 1:
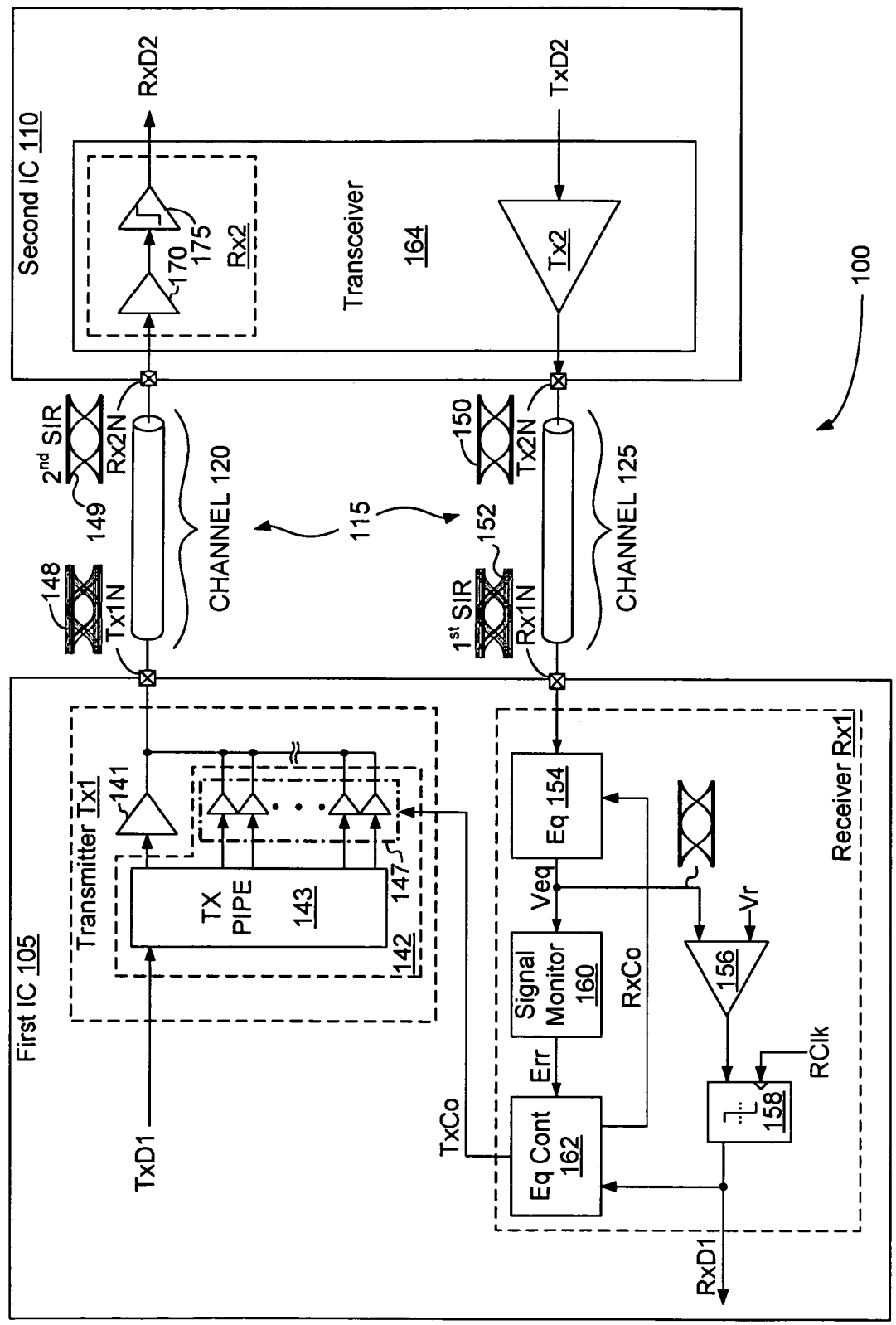
FIG. 1 illustrates an asymmetrical signaling system 100 in accordance with one embodiment.

FIG. 1 illustrates an asymmetrical signaling system 100 in accordance with one embodiment. System 100 includes a first integrated circuit (IC) device 105 coupled to a second IC device 110 via a high-speed signal lane 115. In this example, lane 115 includes a transmit channel 120 and a receive channel 125, which may comprise circuit-board traces. The transmit and receive channels may be implemented over the same conductor or set of conductors in other embodiments. Device 105 may be fabricated using a process that affords considerably higher transmit and receive circuit density and speed performance than the process employed in fabricating device 110. In one embodiment, for example, the minimum feature size for input/output transistors on device 105 is less than 50% of the minimum feature size for input/output transistors on device 110. In other embodiments, device 105 has at least twice the number of interconnect layers as device 110, allowing more compact implementation of complex circuits. Communication system 100 accommodates the resulting performance asymmetry between devices 105 and 110 by instantiating the majority of the complex equalization circuitry on device 105. Transmit and receive channels 120 and 125 can thus support the same relatively high symbol rate without burdening the second IC 110 with the area and power required to support complex equalization circuits.

Performance asymmetry between communicating devices might be desirable for reasons other than or in addition to process differences. For example, market demands may weigh more heavily on one of a pair of communicating devices, making it economically advantageous to minimize the complexity of that device. Also, total system cost can be reduced where the performance-enhanced circuitry can be instantiated on one or a relative few devices that communicate with a greater number of less sophisticated devices.

Device 105 includes a transmitter Tx1 that transmits data received from an internal transmit-data input node TxD1 over channel 120 via a first transmitter pad Tx1N, and further includes a receiver Rx1 that receives data from channel 125 via a first receiver pad Rx1N. Device 110 includes a second transmitter Tx2 that transmits data to receiver Rx1 via a second transmitter pad Tx2N, channel 125, and first receiver pad Rx1N. Device 110 further includes a second receiver RX2 that receives the data transmitted from transmitter Tx1 via first transmitter pad Tx1N, channel 120, and a second receiver pad Rx2N.

Transmitter Tx1 includes an output driver 141 and a multi-tap transmit equalizer 142. Transmit equalizer 142 is composed of a transmit pipe 143 and an array of one or more output drivers or sub-drivers 147 in the depicted embodiment. Output driver 141 and sub-drivers 147 function collectively to drive an equalized version of a transmit data signal TxD1 onto transmitter pad Tx1N, which may be a bond pad of device 105. The particular transmit equalizer in this embodiment may also be referred to as a finite-impulse-response (FIR) equalizer. Equalizers on the transmit-side of a communication channel are sometimes referred to as "pre-emphasis equalizers" or "de-emphasis equalizers" because they emphasize or de-emphasize signal components prior to transmission over the channel in order to mitigate the degrading effects of the channel. For example, transmit equalization, typically a flattening of the total amplitude response over a frequency band of interest, can be accomplished by amplifying (emphasizing) the signal frequency components most sensitive to channel loss, by attenuating (deemphasizing) signal components that are less sensitive to channel loss, or by a combination of the two. The goal of equalization is typically to reduce or minimize the effects of ISI observed at the receive side of the channel (e.g. at pad or pads Rx2N). Equalization is typically accomplished by adjusting a characteristic of a signal in order to mitigate the effects of ISI.

Channels 120 and 125 are assumed to act as simple low-pass filters in this example. For each transmitted symbol, equalization signals from sub-drivers 147 combine with the main signal from driver 141 to selectively deemphasize low-frequency signal components relative to high-frequency signal components, and thus to compensate in advance for the low-pass nature of channel 120. Transmitter Tx1 therefore transmits a waveform 148 with a relatively low signal-to-ISI ratio (SIR) on node Tx1N. Channel 120 filters out much of the ISI, and the resulting propagated signal arrives at node Rx2N of receiver Rx2 as a relatively high SIR waveform 149. The transmit signal Tx1N conveyed over channel 120 may be a binary, differential, AC-coupled voltage signal. Other embodiments may employ signals that are e.g. single-ended, multilevel, DC coupled, or current driven. Moreover, the frequency response of a given channel may differ considerably from a simple low-pass filter. Many variations will be evident to those skilled in the art.

Each of sub-drivers 147 is either a pre-tap sub-driver or post-tap sub-driver. If driver 141 has already transmitted the symbol value at the input to a given sub-driver, that sub-driver is a post-tap sub-driver; if driver 141 has yet to transmit the symbol value at the input to the sub-driver, that sub-driver is a pre-tap driver. Transmit pipe 143 might select, for example, N post-tap drivers and one pre-tap driver; accordingly, the signal at transmitter pad Tx1N would have a signal level according to data values having symbol latencies of −1, 0, 1, 2, ..., N, where the symbol latency of a given data value refers to the number of symbol times by which the data value of the sub-driver lags that through the main driver 141. In an alternate embodiment the entire driver can be realized as a high-speed digital-to-analog converter (DAC) structure which can drive arbitrarily complex waveforms (to the DAC resolution), and the pre-emphasis may be computed in the digital domain on signals that are provided to the DAC inputs.

Different numbers of post-tap and pre-tap drivers may be provided in alternative embodiments, thereby allowing for transmit equalization based on values having different symbol latencies with respect to the main tap. The respective tap weights of sub-drivers 147 can be controlled by application of transmit coefficients TxCo to a corresponding port. Each of the transmit coefficients may be adjusted over a range of values to tailor transmitter Tx1 to a particular channel and noise environment. Such adjustments can be applied once, e.g. at power-up, or can be adapted periodically during system operation to account for changes in the system environment that may impact performance. Methods and circuits for setting transmit coefficients in accordance with some embodiments are discussed below.

Transmitter Tx2 transmits a signal 150 having a relatively high SIR at node Tx2N as can be observed by the relatively clean opening of the eye diagram. Channel 125 induces ISI and loss that degrades signal 150, and thus presents a signal 152 having a relatively low SIR on node Rx1N. An equalizer 154 within receiver Rx1 equalizes signal 152 to compensate for the channel ISI, and thus produces an equalized signal Veq. Continuous-time equalizers, decision-feedback equalizers (DFE), and partial response DFE equalizers, among others, are types of equalizers known to those skilled in the art that may be used for equalizer 154. A differential amplifier 156 compares equalized signal Veq with a reference voltage Vr, and a sampler 158 periodically samples the output of amplifier 156 to recover the data RxD1 expressed in signal TxD2 from transmitter Tx2.

Receiver Rx1 additionally includes a signal monitor 160 and equalization control circuitry 162. Signal monitor 160 provides an error signal Err that can be used as a measure of the signal ISI remaining on equalized signal Veq. Equalization control circuitry 162 employs error signal Err and in some embodiments the recovered data RxD1 to adjust receive coefficients RxCo that control equalizer 154 to minimize the ISI on equalized signal Veq.

Control circuitry 162 further adjusts transmit coefficients TxCo to transmitter Tx1 to minimize the ISI on signal 149, which is at the far end of channel 120. In other words, control circuitry 162 adjusts transmit equalizer 142 such that the waveform conditioning induced on signal 148 closely compensates for the undesired ISI imposed by channel 120, and therefore minimizes the impact of channel-induced ISI at node Rx2N of device 110 based on the behavior of the receive equalizer in Receiver Rx1.

Transmit coefficients TxCo may be generated based upon the characteristics of transmit channel 120. In some such embodiments, a signal monitor on receiver Rx2 and a back-channel communication link may be used to communicate error signal measurement information from device 110 to 105. In the depicted embodiment, control circuitry 162 instead derives transmit coefficients TxCo from the characteristics of receive channel 125. Such derivations may be used where the transmit and receive channels exhibit similar characteristics: e.g. frequency-dependent attenuation, dispersions, and/or reflections. Such assumptions are particularly valid when channels 120 and 125 are the same channel and transmission is bi-directional, or when channels 120 and 125 are portions of a parallel bus between IC 105 and IC 110. Deriving transmit coefficients from receive-channel characteristics reduces or eliminates the need for evaluating signal quality at receiver Rx2, which in turn reduces the requisite complexity of second IC 110.

Turning now to second IC 110, receiver Rx2 and transmitter Tx2 are each part of a transceiver 164 that conveys data to and from some core logic (not shown), such as one or more blocks of dynamic random-access memory cells. Receiver Rx2 may be simple relative to receiver Rx1, and here includes a preamplifier 170 and a sampler 175. Preamplifier 170 may support data threshold-voltage adjustments and sampler 175 may support timing adjustments, in which case the sample voltage and timing of receiver Rx2 may be centered within received data eyes at the input of sampler 175. Though not shown, receiver Rx2 can additionally include some simple receive-equalization circuitry, though this can be less complex—and consequently less expensive and area-intensive—than the circuitry of receiver Rx1. Transmitter Tx2 can likewise provide some transmit equalization, but the circuitry employed for this purpose can be less complex than the circuitry transmitter Tx1 employs for this purpose. For example, transmitter Tx2 can have fewer filter taps than transmitter Tx1, or have fixed tap settings that are known to provide a minimal baseline of equalization.

Figure 2A:
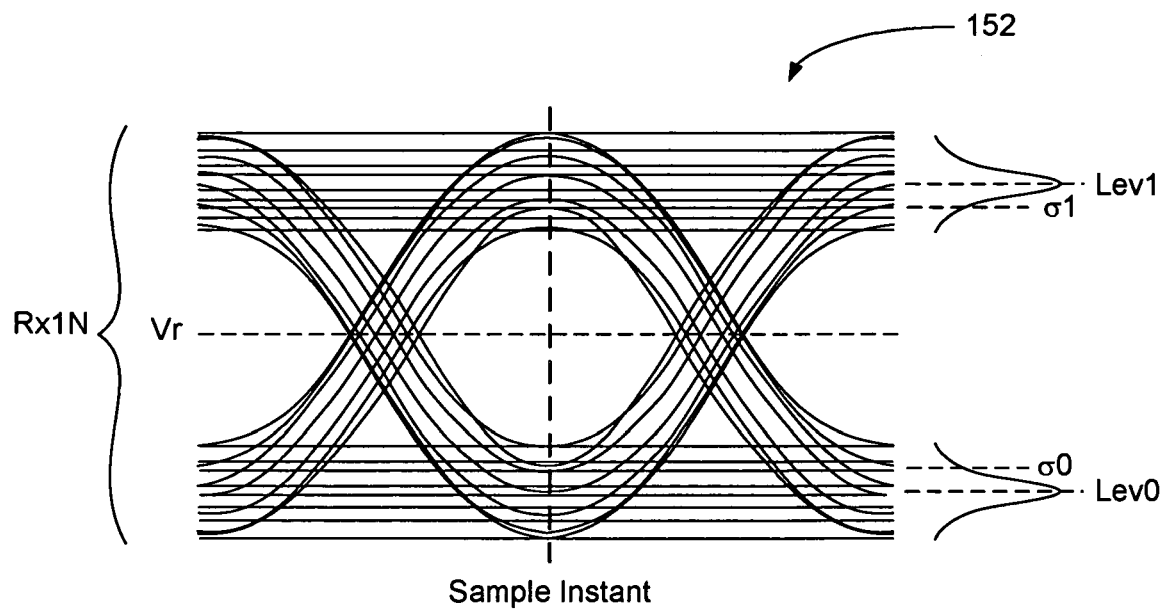
FIGS. 2A and 2B depict hypothetical waveforms illustrative of signals 152 and 149 on respective receiver pads Rx1N and Rx2N.
Figure 2B:
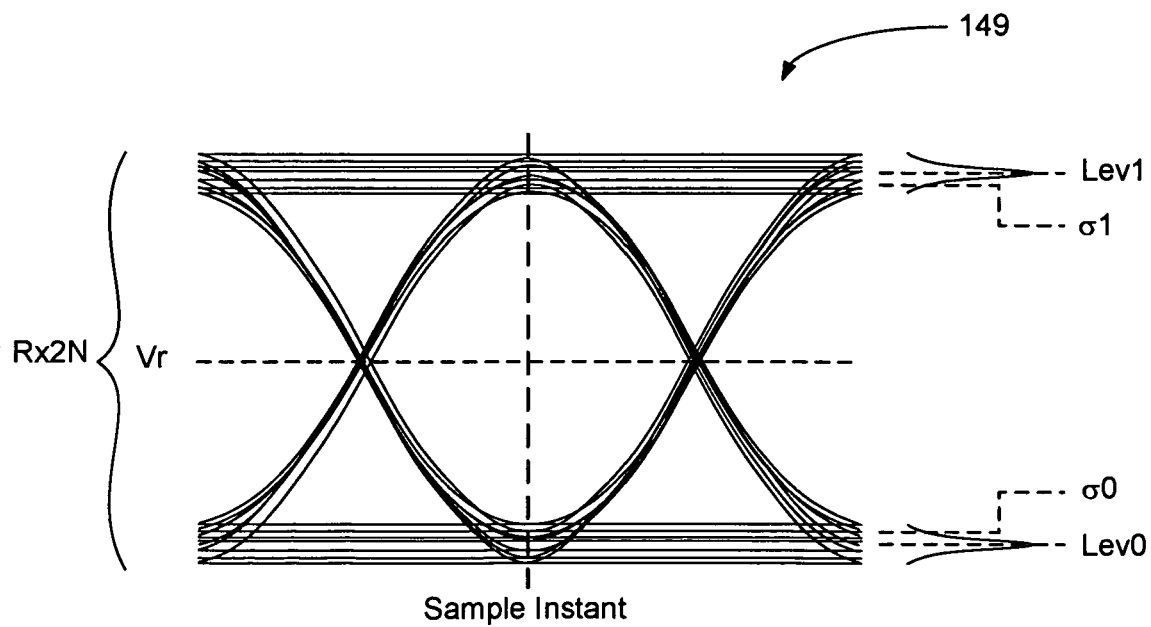

FIGS. 2A and 2B depict hypothetical waveforms illustrative of signals 152 and 149 on respective receiver pads Rx1N and Rx2N. Each waveform includes a respective signal eye that exhibits a signal-to-interference ratio (SIR) at the sample instant. Given that there are a number of ways to measure the SIR of a signal, the present disclosure refers to the particular measure of interest here as the "eye SIR," or just SIR. Each reference to an SIR pertains to this particular measure.

In FIG. 2A, the voltage levels labeled Lev1 and Lev0 represent the average levels representing logic ones and logic zeros, respectively. The standard deviations of the voltage levels in cases where a logic one or a logic zero is received are denoted by $\sigma 1$ and $\sigma 0$, respectively. The separation between Lev1 and receiver threshold Vr is the amount of received "signal" for a logic one, and the ratio between this amount and $\sigma 1$ may be used to compare the signal and interference levels when a logic one is received. Similarly, the ratio of the separation between Lev0 and Vr to $\sigma 0$ may be used when a logic zero is received. The lower of these two ratios is usually a critical factor in the bit error rate of the receiver. Therefore, we define the SIR in equation form:

$$SIR = Min(|Lev1 - Vr|/\sigma 1, |Lev0 - Vr|/\sigma 0) \quad \text{Eq. 1}$$

Transmitter Tx2 is relatively unsophisticated, so the signal at node Rx1N exhibits considerable noise (e.g. ISI) as a result of the dispersion and reflections of channel 125. As shown, waveform 152 at receiver pad Rx1N exhibits a relatively low SIR. In contrast, the relatively sophisticated equalizer of transmitter Tx1 compensates for the attenuation of write channel 120 in advance of transmission. The resulting waveform 149 at receiver pad Rx2N therefore exhibits a relatively high SIR as compared with that of waveform 152. In one embodiment, the SIR at receiver pad Rx2N is at least 30% higher than the SIR at receiver pad Rx1N. Other embodiments may adapt equalizers for similar objectives, such as maximizing the signal-to-noise difference (vertical eye opening) instead of the signal-to-noise ratio, maximizing the horizontal eye opening relative to jitter, or minimizing the overall bit-error rate (BER) of the channel.

The symbol rates of signals conveyed over channels 120 and 125 may be maintained substantially equal despite the performance asymmetry between devices 105 and 110. The sophisticated equalization employed by transmitter Tx1 allows for a high-quality (high SIR) signal at node Rx2N, and thus facilitates use of a relatively simple receiver Rx2, and the sophisticated equalization employed by receiver Rx1 allows receiver Rx1 to correctly interpret low-quality (low SIR) signals, and thus facilitates use of a relatively simple transmitter Tx2.

Figure 3:
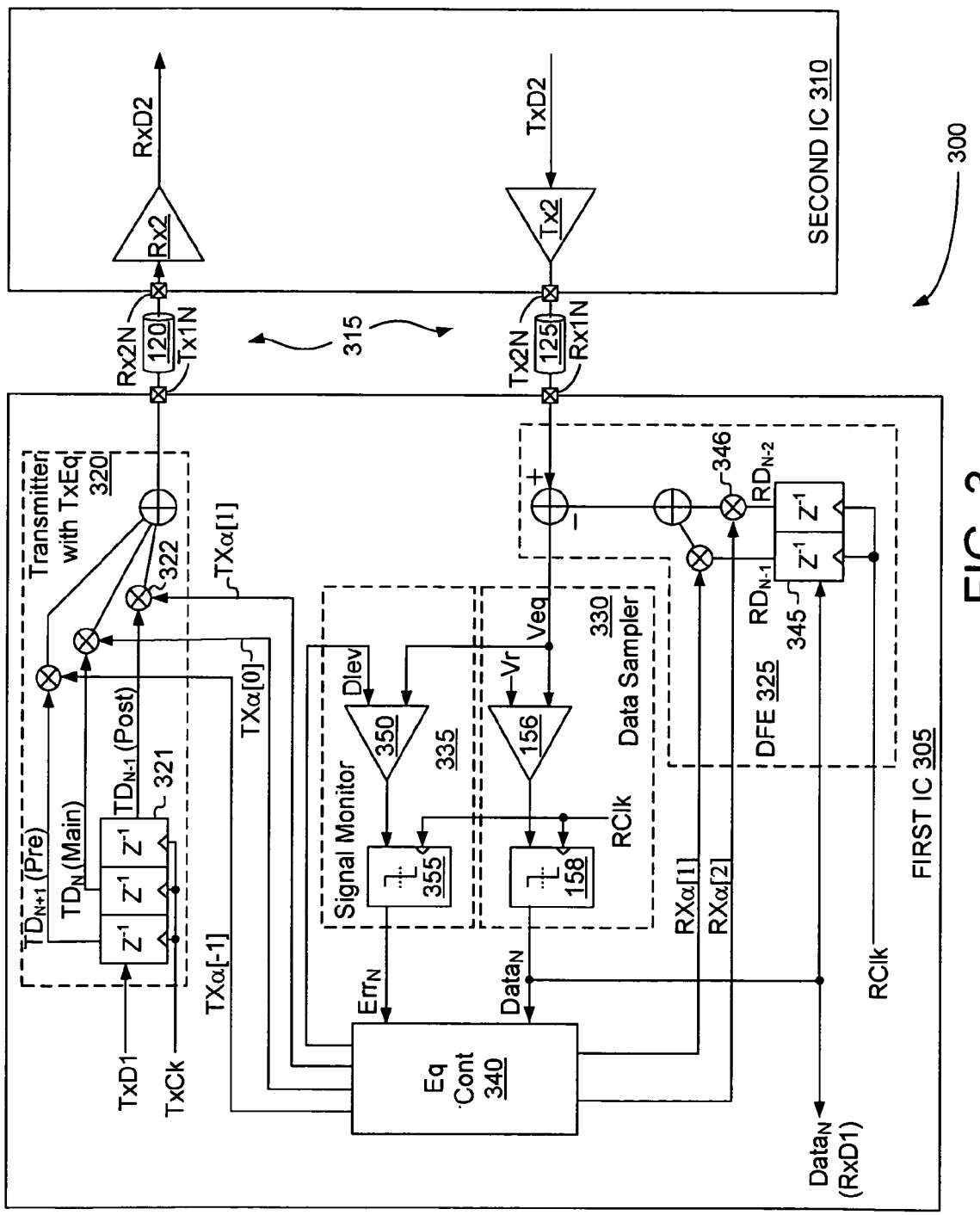
FIG. 3 depicts a high-speed communication system 300 in accordance with another embodiment.

FIG. 3 depicts a high-speed communication system 300 in accordance with another embodiment. System 300 includes first and second IC devices 305 and 310 separated by a signal lane 315. The embodiment of FIG. 3 is in some ways like system 100 of FIG. 1, like-numbered elements being the same or similar.

First device 305 includes a transmitter 320 that supports transmit equalization, e.g. of the type discussed above in connection with FIG. 1. Device 305 additionally includes a receive equalizer 325, a data sampler 330, a signal monitor 335, and equalization control circuitry 340. Second device 310 is similar to second device 110 of FIG. 1: a detailed discussion of device 310 is therefore omitted for brevity.

Transmitter 320 includes a three-tap transmit equalizer, which in turn includes a FIFO buffer 321 and three coefficient multipliers 322. The transmit equalizer is a finite impulse response (FIR) equalizer in this example, though other types of equalizers may be used instead of or in addition to an FIR.

Buffer 321 presents pre-tap data $TD_{N+1}$, current (main) data $TD_N$, and post-tap data $TD_{N-1}$ to respective coefficient multipliers 322. Multipliers 322 multiply the outputs of buffer 321 by respective tap coefficients $TX\alpha[1, 0, -1]$, and the sum of the outputs of multipliers 322 is presented on pad or pads Tx1N as the output of transmitter 320.

Receive equalizer 325 supports two post-cursor filter taps in this embodiment, though more or fewer may be used in other embodiments. Equalizer 325 is a decision-feedback equalizer (DFE) in this example, though other types of equalizers may be used instead of or in addition to a DFE. For example, equalizer 325 may include one or more partial-response DFE (PrDFE) taps, for example of the type described in published U.S. Patent App. No. 20050111585 to Stojanovic et al. entitled "Partial Response Receiver." A buffer 345 presents first post-tap data $RD_{N-1}$ (first post cursor) and second post-tap data (second post cursor) data $RD_{N-2}$ to respective coefficient multipliers 346. Multipliers 346 multiply the outputs of buffer 345 by respective tap coefficients $RX\alpha[2,1]$, and the sum of the outputs of multipliers 345 is subtracted from the incoming signal at pad or pads RxN1 to produce an equalized signal Veq. Alternatively, receive equalizer 325 could be implemented as a direct continuous-time, linear equalizer with tunable coefficients. In general, an equalizer can adjust the SIR at a particular node in the receiver to achieve some desired characteristic, e.g. a low bit-error rate or, as in the case of a PrDFE, can speculatively apply multiple ISI corrections and later select the appropriate correction to achieve the desired characteristic.

An amplifier 350 within signal monitor 335 compares signal Veq with a selected data level Dlev, outputting a signal indicative of a logic one (zero) if Veq is greater than (less than) level Dlev. A sampler 355 periodically captures the output from amplifier 350 on rising edges of a receive clock signal RClk to produce a series of error samples $Err_N$. Error samples $Err_N$ are conveyed to equalizer control circuitry 340 as measures of signal ISI for equalized signal Veq.

Amplifier 156 compares signal Veq with reference voltage Vr (e.g. zero volts), outputting a signal indicative of a logic one (zero) if Veq is greater than (less than) level Vr. Sampler 158 periodically captures the output from amplifier 156 on rising edges of receive clock signal RClk to produce a series of data samples $Data_N$. Data samples $Data_N$ are conveyed to equalizer control circuitry 340 and to any other circuitry (not shown) to which the received data RxD1 is directed. In accordance with the depicted embodiment, control circuitry 340 employs the data and error samples to derive data level Dlev, transmit equalization coefficients $TX\alpha[1,0,-1]$ for transmitter 320, and receive equalization coefficients $RX\alpha[2,1]$ for receive equalizer 325.

Figure 4A:
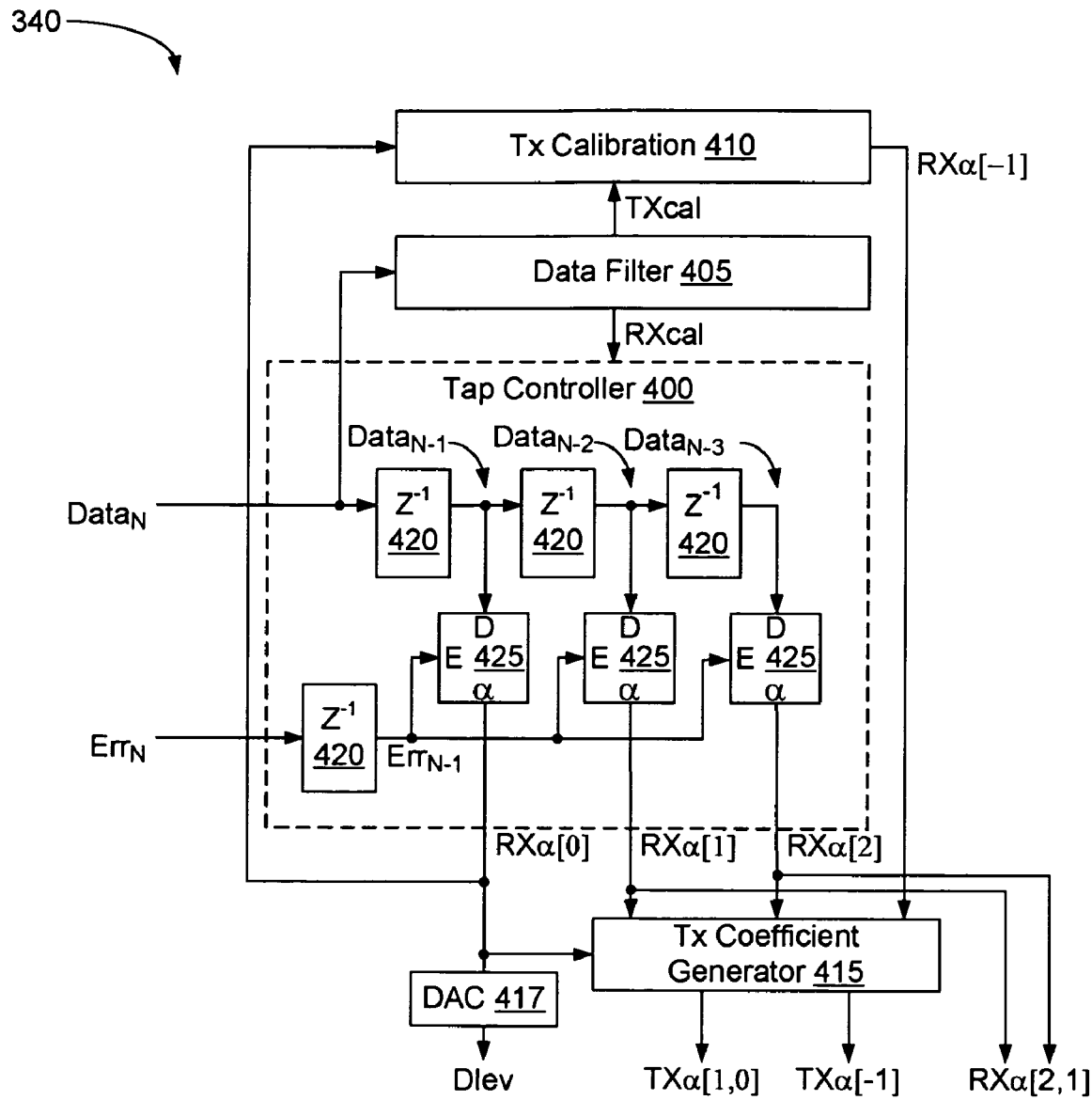
FIG. 4A depicts equalization control circuitry 340 in accordance with one embodiment.

FIG. 4A depicts equalization control circuitry 340 in accordance with one embodiment. Control circuitry 340 includes a tap controller 400, a data filter 405, transmit calibration block 410, a transmit-coefficient generator 415, and a DAC 417. Tap controller 400 includes a series of synchronous storage elements 420 and tap-value generators 425 that together generate, from data and error samples $Data_N$ and $Err_N$, tap coefficients $RX\alpha[2,1,0]$. Tap value $RX\alpha[0]$ is a digital measure of the average amplitude of the received data symbols $Data_{N-1}$, which DAC 417 converts into voltage Dlev. Tap values $RX\alpha[2,1]$ are the receive coefficients for equalizer 325.

The error comparisons that produce error signals $Err_N$ are based upon the upper signal level defined by voltage Dlev and applied via amplifier 350. Tap controller 400 thus only updates the tap values $RX\alpha[2,1,0]$ based upon measurements that take place when the data sample $Data_{N-1}$ is a logic one. Data filter 405 therefore prevents updates to tap controller 400 when the sample $Data_{N-1}$ is a logic zero. Other embodiments can include a second comparator/sampler pair to generate error samples when $Data_{N-1}$ is a logic zero, such as by comparing the incoming signal Veq with the lower data level −Dlev, or the reference voltage to comparator 350 can be varied over a number of values or ranges of values to facilitate additional testing and error-correction methods.

Receive coefficients RXα[2,1,0] are adjusted to account for the transfer characteristics of receive channel 125. The calibrated receive coefficients RXα[2,1,0] are therefore measures of the transfer function for channel 125. Assuming transmit channel 120 and receive channel 125 exhibit similar transfer characteristics, receive coefficients RXα[2,1,0] are also a measure of the transfer characteristics of transmit channel 120. Devices in accordance with some embodiments use receive coefficients to derive suitable transmit coefficients. In the embodiment of FIG. 4A, this derivation additionally takes into account a pre-cursor receive coefficient RXα[−1] produced by calibration block 410 but not used for receive-side equalization in this example. Coefficient generator 415 may then derive transmit coefficients from receive coefficients e.g. in a manner detailed below.

Figure 4B:
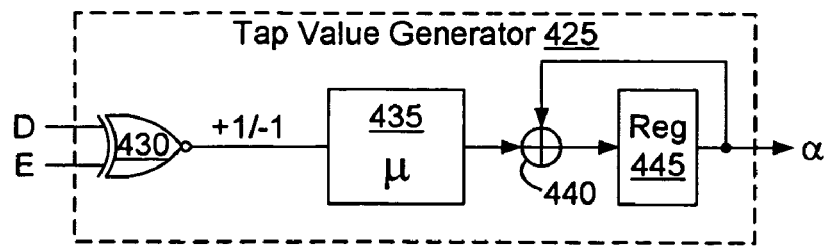
FIG. 4B details an embodiment of a tap-value generator 425 of FIG. 4A that generates a tap value using a sign-sign, least-mean-squared (LMS) algorithm.

FIG. 4B details an embodiment of a tap-value generator 425 of FIG. 4A that generates a tap value using a sign-sign, least-mean-squared (LMS) algorithm. Other algorithms, such as linear or gradient-descent LMS, can be used in other embodiments. Generator 425 includes an XNOR gate 430, a multiplier 435 that multiplies the output of XNOR gate 430 by a constant μ, an adder 440, and a register 445. XNOR gate 430 compares the corresponding data and error samples and presents its output to multiplier 435. The output of XNOR gate 430 represents a logic one for true and a logic negative one for false. The data and error samples represent the signs of the sampled values, so XNOR gate 430 has the effect of multiplying the signs and presenting the resulting product to multiplier 435. Multiplier 435 multiplies the product from XNOR gate 430 by a selected step size μ, which may be tailored for the selected filter tap. Adder 440 adds the output from multiplier 435 to the current contents of register 445, which is then updated with the new count. Register 445 thus accumulates a count representative of the alpha value for the filter tap associated with the data samples of a particular latency.

FIGS. 5A through 5D are hypothetical waveform diagrams used in connection with FIGS. 3 and 4A to illustrate the process of applying appropriate receive coefficients RXα[2,1] to DFE 325 to correct for ISI introduced over channel 125. FIG. 5A depicts an idealized transmit pulse 500 for which the value expressing the current data sample $D_N$ at transmitter pad Tx2N is normalized to a value of one (1.0) and the prior and subsequent data samples $D_{N-1}$ and $D_{N+1}$ are each normalized to a value of zero (0.0). FIG. 5B depicts, as a pulse 505, a version of transmit pulse 500 filtered by receive channel 125 and appearing at pad Rx1N. As compared with pulse 500, pulse 505 is attenuated to a maximum amplitude of 0.5 for the current data sample $D_N$, the corrupted version of which is labeled $cD_N$. The pulse is further corrupted by channel ISI, which leads to erroneous positive signal amplitudes of approximately $cD_{N+1}$=0.12 and $cD_{N+2}$=0.02 at the two succeeding symbol times, and $cD_{N-1}$=0.05 at the preceding symbol time. The objective of receive equalization is, in part, to compensate for the ISI effects at the symbol times succeeding the main symbol time.

FIG. 5C is a waveform diagram 510 in which a receive-coefficient waveform 515 is shown with the shape of pulse 505 of FIG. 5B to illustrate how the receive coefficients are applied to compensate for ISI imposed by channel 125. In the example, the channel 125 imposed ISI components $cD_{N+1}$ and $cD_{N+2}$ of respective amplitudes 0.12 and 0.02 at the two symbol times succeeding reception of corrupted data symbol $cD_N$. DFE 325 therefore subtracts a coefficient waveform 515 from the received pulse 505 to cancel the ISI: DFE 325 subtracts $Data_N*RX\alpha[1]$ from the received signal one symbol time after $cD_N$ and subtracts $Data_N*RX\alpha[2]$ from the received signal two symbol times after $cD_N$. In this example, RXα[0] is about 0.50, RXα[1] about 0.12, and RXα[2] about 0.02.

FIG. 5D depicts an equalized waveform 520 that is the sum of waveforms 505 and 515 of FIG. 5C. Ideally, the compensation provided by DFE 325 exactly counteracts the ISI associated with the prior data symbols without adversely impacting the current symbol. In practice, however, the application of receive coefficients may impact the current symbol $eD_N$. Furthermore, ISI associated with the first pre-cursor tap is not cancelled in this example, and therefore leaves a noise artifact $cD_{N-1}$ in waveform 520 one symbol time prior to receipt of the current symbol. The two post-tap artifacts are cancelled in this example, however, leaving equalized signal values $eD_{N+1}$ and $eD_{N+2}$ of amplitude zero.

Returning to FIG. 4A, coefficient generator 415 employs receive coefficients RXα[1,0,−1] to calculate transmit coefficients TXα[1,0,−1]. In the description thus far, however, tap controller 400 has calculated only two of the three receive coefficients employed by coefficient generator 415. The following discussion shows how equalization controller 340 of FIG. 3 can calculate a pre-cursor receive-channel coefficient RXα[−1] in accordance with one embodiment.

Figure 6:
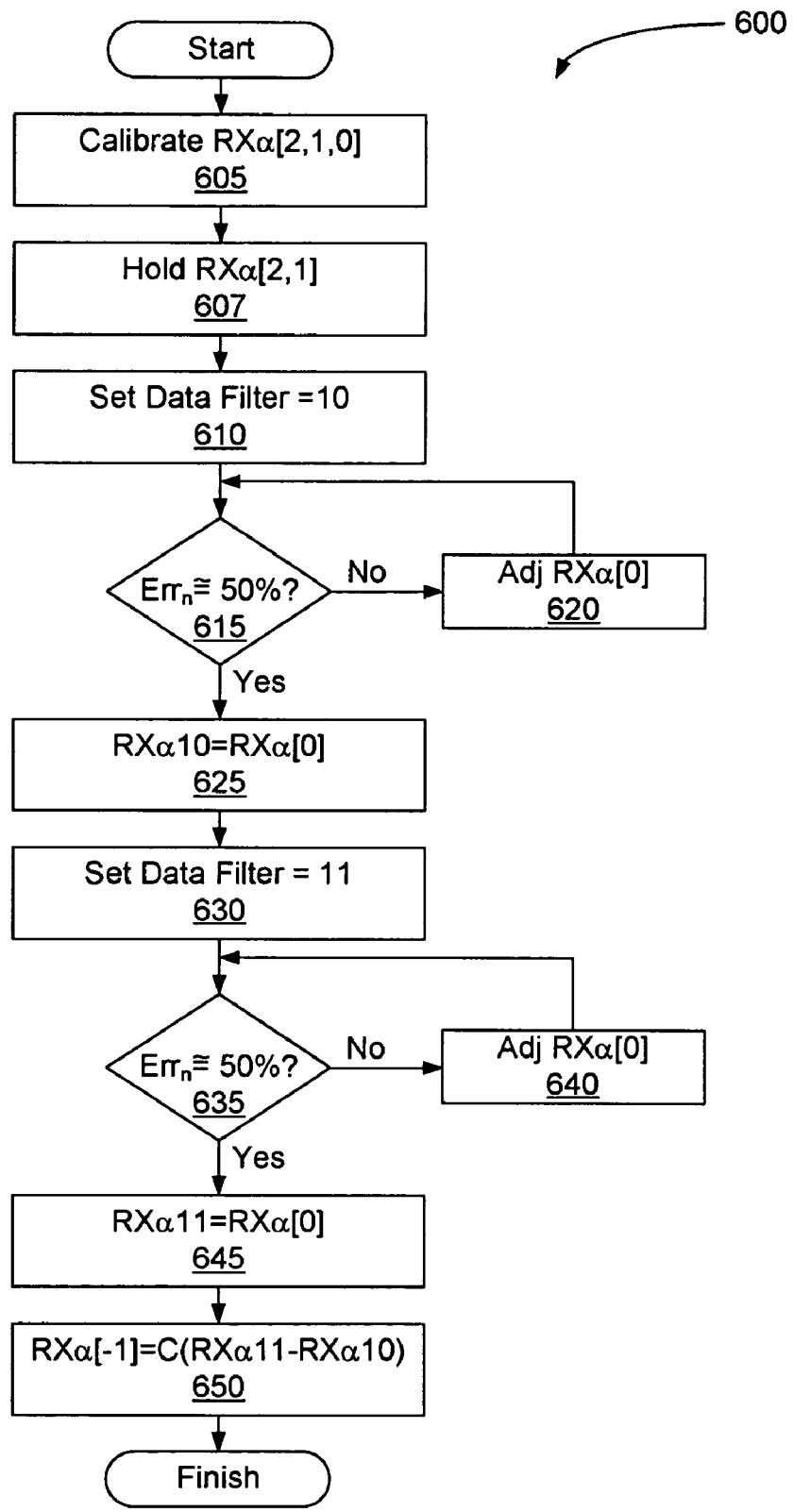
FIG. 6 is a flowchart 600 outlining a process by which calibration block 410 may calculate pre-cursor transmit coefficient TXα[−1].

FIG. 6 is a flowchart 600 outlining a process by which calibration block 410 may calculate pre-cursor receive-channel coefficient RXα[−1]. First, in step 605, the receive coefficients RXα[2,1,0] are calculated in the manner detailed above. In some embodiments, step 605 is accomplished by first holding values RXα[2,1] constant until value RXα[0] reaches equilibrium, at which time voltage Dlev represents a measure of the average symbol amplitude for signal Veq. With reference to FIG. 3, voltage Dlev is considered to represent the amplitude of signal Veq when error signal $Err_{N-1}$ is equally likely to express a logic one or a logic zero when the corresponding sampled data symbol $Data_{N-1}$ represents a logic one. Once voltage Dlev is established, the other two tap-value generators are enabled to find the remaining receive coefficients RXα[2,1]. Once calibrated, the values of receive coefficients RXα[2,1] are held constant (step 607).

Next, in step 610, data filter 405 is set to enable Dlev adjustment when incoming data expresses the pattern "10" (i.e., symbol $Data_{N-1}$=1 and succeeding symbol $Data_N$=0). Per decision 615 and step 620, error samples $Err_{N-1}$ are collected and coefficient RXα[0] adjusted until $Err_{N-1}$ is again 50% 1's and 50% 0's when this pattern is detected. Using the circuitry of FIG. 4A, these adjustments occur automatically as tap controller 400 finds the coefficient RXα[0], and consequently the level Dlev, specific to "10" data patterns. In step 625, calibration block 410 then stores the value of coefficient RXα[0] as RXα10. The process of steps 610 through 625 is repeated for data pattern "11". That is, in step 630 data filter 405 is set to enable Dlev adjustment when incoming data expresses the pattern "11" (i.e., symbol $Data_{N-1}$=1 and succeeding symbol $Data_N$=1). Per decision 635 and step 640, error samples $Err_{N-1}$ are collected and coefficient RXa[0], and consequently level Dlev, is adjusted until $Err_{N-1}$ is again 50% 1's and 50% 0's. Calibration block 410 then, in step 645, stores the new value of RXα[0] as RXα11.

With coefficients RXα[2,1] calibrated, the difference between values RXα11 and RXα10 can largely be attributed to two times the ISI associated with the first pre-cursor filter position. Filter coefficient $RX\alpha[-1]$ can therefore be calculated using this difference (step 650). In some embodiments the difference may be scaled, as by multiplying the difference by a constant C, or may be otherwise adjusted, for example, to compensate for different transmit characteristics between the controller and memory device. Other embodiments employ similar techniques to calculate additional pre- or post-cursor transmit or receiver filter coefficients. Returning to the hypothetical example of FIGS. 5A through 5D, it may be seen that corrupted data sample $cD_{N-1}$ has a value of about 0.05, so coefficient $RX\alpha[-1]$ is set to 0.05.

Transmitter 320 of FIG. 3 typically has a maximum output power that is divided among its three taps. For illustrative purposes, that output power may be normalized to a value of one. Coefficient generator 415 (FIG. 4A) is therefore constrained, in this embodiment, such that the sum of the absolutes values of the three filter coefficients $TX\alpha[1,0,-1]$, which represents the total power output of the transmitter, is equal to one. In equation form:

$$|TX\alpha[1]|+|TX\alpha[0]|+|TX\alpha[-1]|=1 \qquad \text{Eq. 2}$$

Assuming similar transmit and receive channels, the following relationships between the transmit and receive coefficients can be used in the embodiment to approximately correct for ISI in channel 120:

$$TX\alpha[1]/TX\alpha[0]=-RX\alpha[1]/RX\alpha[0] \qquad \text{Eq. 3}$$

$$TX\alpha[-1]/TX\alpha[0]=-RX\alpha[-1]/RX\alpha[0] \qquad \text{Eq. 4}$$

Combining equations two through four and solving for each transmit coefficient gives:

$$TX\alpha[1]=(-RX\alpha[1]/RX\alpha[0])/(1+|RX\alpha[1]/RX\alpha[0]|+|RX\alpha[-1]/RX\alpha[0]|) \qquad \text{Eq. 5}$$

$$TX\alpha[0]=(1+|RX\alpha[1]/RX\alpha[0]|+|RX\alpha[-1]/RX\alpha[0]|)^{-1} \qquad \text{Eq. 6}$$

$$TX\alpha[-1]=(-RX\alpha[-1]/RX\alpha[0])/(1+|RX\alpha[1]/RX\alpha[0]|+|RX\alpha[-1]/RX\alpha[0]|) \qquad \text{Eq. 7}$$

The transmit coefficients, including one or more pre-emphasis coefficients, can thus be derived using receive coefficients as a measure of transmit-channel characteristics. In the example discussed above in connection with FIGS. 5A-5D, the hypothetical receive coefficients $RX\alpha[1,0,-1]$ were about 0.12, 0.5, and 0.05, respectively. Applying these results to equations five through seven gives approximately: $TX\alpha[1]=-0.18$, $TX\alpha[0]=0.75$, and $TX\alpha[-1]=-0.07$.

A more comprehensive solution if $RX\alpha[-2]$ and $RX\alpha[2]$ are measured (using a similar method to that in FIG. 6) is to solve the following matrix equation for $TX\alpha[1]$, $TX\alpha[0]$, and $TX\alpha[-1]$:

$$[0\ 1\ 0] = [TX\alpha[-1]\ TX\alpha[0]\ TX\alpha[1]] \cdot \begin{bmatrix} RX\alpha[0], & RX\alpha[1], & RX\alpha[2] \\ RX\alpha[-1], & RX\alpha[0], & RX\alpha[1] \\ RX\alpha[-2], & RX\alpha[-1], & RX\alpha[0] \end{bmatrix} \qquad \text{Eq. 8}$$

This solution must then be normalized to a total amplitude of one by dividing the solution by $|TX\alpha[1]|+|TX\alpha[0]|+|TX\alpha[-1]|$. This techniques can be used generally for any number of taps on the transmitter equalizer or receive DFE. For example, the matrix of equation 8 may be extended and solved for cases where additional ISI components are measured and additional TX FIR taps are available. In an alternate embodiment, a simple mapping table, which can be realized through a table-lookup ROM, RAM, or through firmware, can provide the means to set TX equalizer coefficients from RX equalizer coefficients.

Figures 7A, 7B, 7C, 7D:
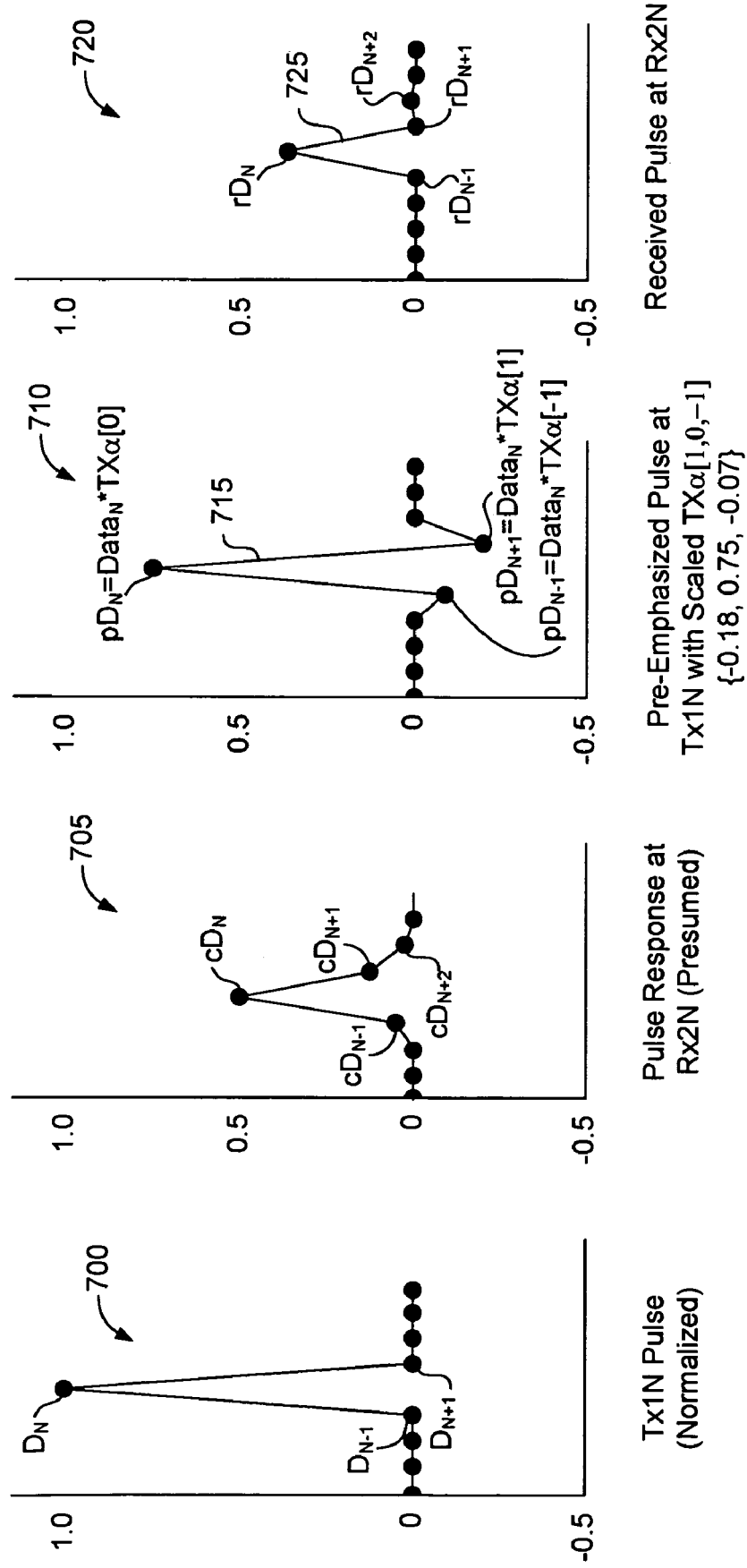
FIGS. 7A through 7D are hypothetical waveform diagrams used to illustrate the effects of applying the above-derived transmit coefficients to signals on transmit channel 120.

FIGS. 7A through 7C are hypothetical waveform diagrams used to illustrate the effects of applying the above-derived transmit coefficients to signals on transmit channel 120. FIG. 7A depicts an idealized transmit pulse 700 for which the value expressing the current data sample $D_N$ at transmitter pad Tx1N is normalized to a value of one (1.0) and the respective prior and subsequent data samples $D_{N-1}$ and $D_{N+1}$ are normalized to values of zero (0.0). As noted previously, transmit channel 120 is presumed to be similar to receive channel 125 for which receive coefficients $RX\alpha[1,0,-1]$ were derived. This is important, as the expected similarity of the transfer characteristics between the receive and transmit channels supports the assumption that transmit equalizer coefficients can be derived from the receive equalizer coefficients and/or ISI measurements. Based upon this assumption, the channel filtered version of pulse 700, as it appears at pad Rx2N, is expected to be relatively similar to pulse 505 of FIG. 5B, and has been illustrated accordingly in FIG. 7B. In other words, assuming the same normalized transmit pulse from transmitters Tx1 and Tx2, receiver pad Rx2N will see a pulse response with substantially the same ISI as would be seen at receiver pad Rx1N. In the example of FIG. 5B, the receive channel of lane 120 attenuated symbol $D_N$ by half, resulting in a corrupted symbol $cD_N$. The receive channel additionally imposed ISI components $cD_{N+2}=0.02$, $cD_{N+1}=0.12$, and $cD_{N-1}=0.05$, so pulse 705 of FIG. 7B is assumed to have the same ISI components.

FIG. 7C is a waveform diagram 710 in which a transmit-coefficient waveform 715 is shown in which a pulse 715 is shaped by application of the transmit coefficients calculated by applying receive coefficients $RX\alpha[1,0,-1]$ to equations two through seven: $TX\alpha[1]=-0.18$, $TX\alpha[0]=0.75$, and $TX\alpha[-1]=-0.07$. Pulse 715 is pre-emphasized using these tap values to produce a transmit-equalized pulse in which the combined output power of pre-emphasized values $pD_{N-1}$, $pD_N$, and $pD_{N+1}$ is one. Ideally, the pre-emphasis provided by the transmit equalizer exactly counteracts the ISI induced by channel 120 without adversely impacting the current symbol.

FIG. 7D is a waveform diagram 720 depicting a pulse 725 at pad Rx2N. Pulse 725 is the shape of the pulse received at Rx2N when pulse 715 of FIG. 7C is transmitted from Tx1N and subsequently filtered by channel 120. The current received value of symbol $rD_N$ is attenuated to about 0.35, while the pre- and post-tap values $rD_{N-1}$ and $rD_{N+1}$ are reduced to approximately zero. Transmitter 320 does not compensate for post-tap corruption at time N+2, so pulse 725 exhibits a non-zero artifact $rD_{N+2}$. Convolution of the transmitted waveform in FIG. 7C with the response of the channel also results in small non-zero artifacts $rD_{N-2}$ and $rD_{N+3}$.

Figure 8:
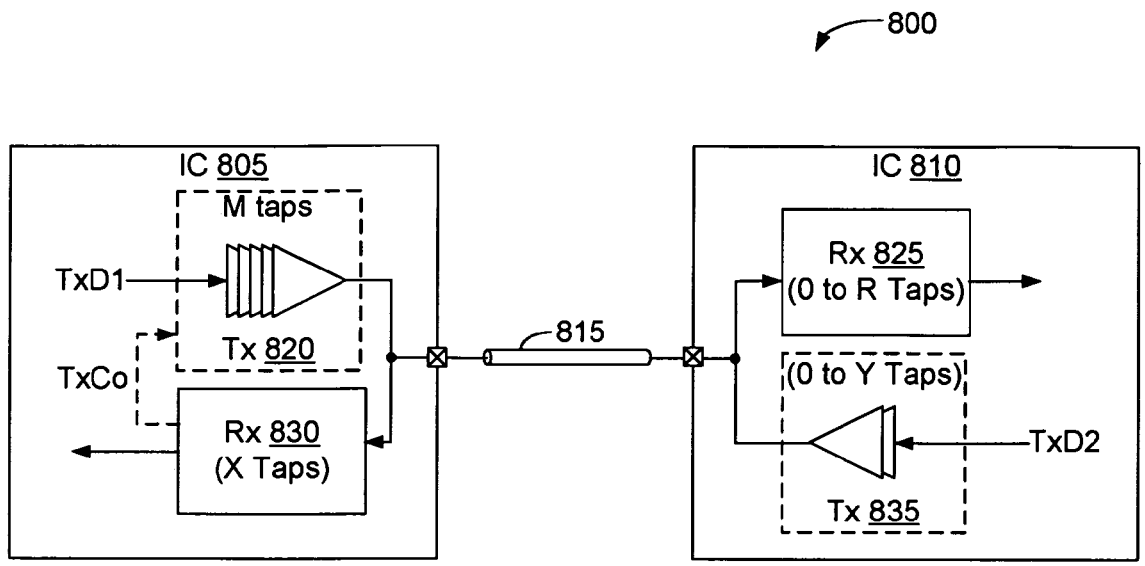
FIG. 8 depicts an asymmetrical signaling system 800 in accordance with another embodiment.

FIG. 8 depicts a system 800 in accordance with another embodiment. System 800 includes a first IC 805 coupled to a second IC 810 via a bidirectional communication channel 815. IC 805 includes transmitter 820 with an M tap FIR equalizer that communicates transmit signals TxD1 to a corresponding receiver 825 on IC 810. Receiver 825 on IC 810 includes from zero to R receive DFE taps, where R is less than X. IC 805 additionally includes receiver 830 with an X-tap DFE that receives pre-emphasized transmissions of signals TxD2 from a corresponding transmitter 835 on IC 810. Transmitter 835 on IC 810 includes from zero to Y transmitter FIR taps, where Y is less than M. In some embodiments, each of M and X is greater than the number of taps in either receiver 825 or transmitter 835. Transmit coefficients TxCo can be derived from characteristics of the receive signal, e.g. in the manner described above.

The complete channel transfer function from IC 805 to IC 810, which includes characteristics of transmitter 820 and receiver 825 (e.g. gain, bandwidth, and edge-rate) may not precisely match the complete channel transfer function in the opposite direction. This may be true even in the case where the channel wire is identical in both directions. The coefficient mapping between receiver 830 and transmitter 820 can be altered to accommodate such differences, however. For example, if transmitter 835 has a known, fixed transfer function, that transfer function can be de-convolved from the transmit filter settings for transmitter 820 using e.g. equation 8. Similarly, if receiver equalizer 825 has a known transfer function, it too can be de-convolved from the transmit filter settings. Adjustments can then be made to the coefficient mapping between receiver 830 and transmitter 820 via table-lookup or other methods.

Figure 9:
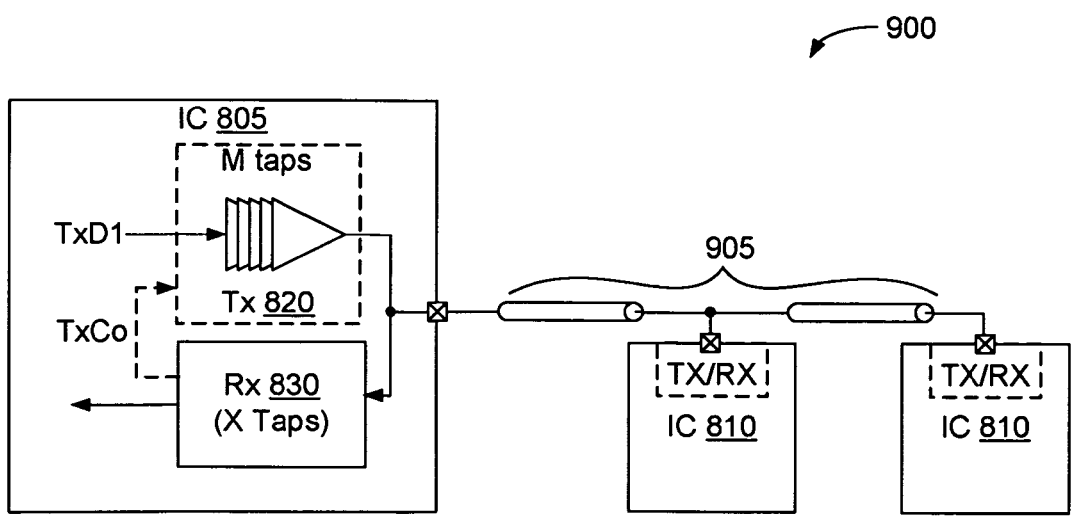
FIG. 9 depicts an asymmetrical signaling system 900 in accordance with yet another embodiment.

FIG. 9 depicts a system 900 in accordance with yet another embodiment. System 900 is similar to system 800 of FIG. 8, like-numbered elements being the same or similar. In system 900, however, IC 805 communicates with a plurality of IC devices 810 via a multi-drop bus 905. FIG. 9 illustrates an additional benefit of embodiments in which relatively complex transmit and receive circuitry are instantiated on one end of a signal lane. In the depicted example, one complex transmitter and one complex receiver are instantiated on IC 805 so that each instance of IC 810 can be implemented using a relatively simpler receiver/transmitter pair. Complexity of one IC can therefore be used to simplify a plurality of other ICs. As in the example of FIG. 8, transmit coefficients TxCo can be derived from characteristics of the receive signal.

Figure 10:
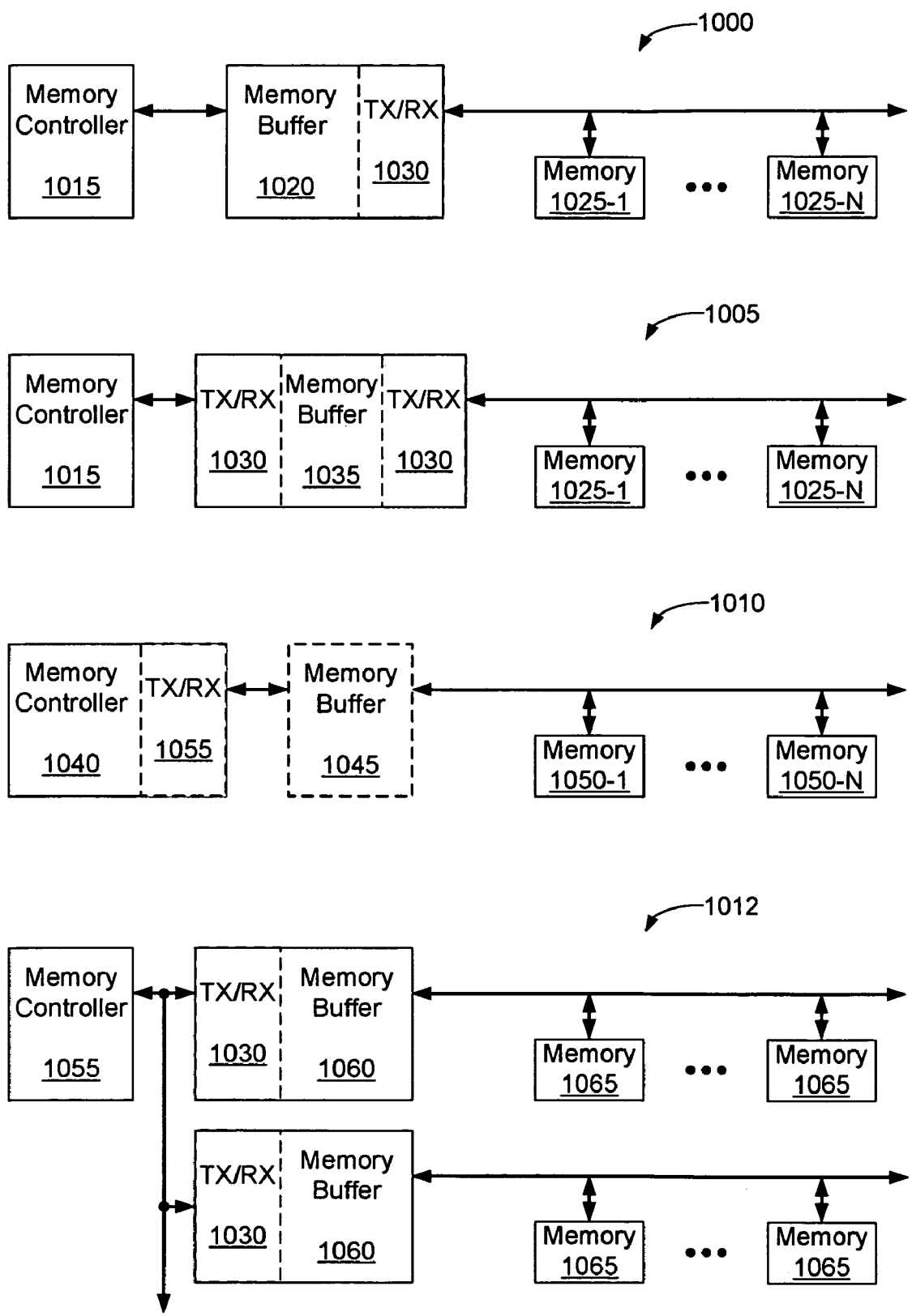
FIG. 10 depicts three memory topologies 1000, 1005, and 1010 that incorporate asymmetrical signaling systems in accordance with various embodiments.

FIG. 10 depicts four memory topologies 1000, 1005, 1010, and 1012 that incorporate asymmetrical signaling systems in accordance with some of many possible embodiments. Topology 1000 includes a memory controller 1015, a memory buffer 1020, and a number N of memory ICs 1025 [N:1]. Memory buffer 1020 includes transmit and receive circuitry 1030 that is relatively complex as compared with the corresponding transceiver circuitry on memory ICs 1025[N:1]. The system of topology 1000 can thus support relatively high symbol rates without burdening memory ICs 1025 [N:1] with the area and power required to support complex equalization circuits.

Topology 1005 is similar to topology 1000, like-numbered elements being the same or similar. In topology 1005, a memory buffer 1035 includes two sets of transmit and receive circuitry 1030: one to communicate with memory controller 1015 and another to communicate with memory ICs 1025 [N:1]. The system of topology 1000 can thus support relatively high symbol rates without burdening memory ICs 1025 [N:1] or memory controller 1015 with the area and power required to support complex equalization circuits.

Topology 1010 includes a memory controller 1040, an optional memory buffer 1045, and a number N of memory ICs 1050[N:1]. Memory controller 1045 includes transmit and receive circuitry 1055 that is relatively complex as compared with the corresponding transceiver circuitry on buffer 1045 and/or memory ICs 1050[N:1]. The system of topology 1010 can thus support relatively high symbol rates without burdening buffer 1045 and/or memory ICs 1050[N:1] with the area and power required to support complex equalization circuits.

Topology 1012 includes a memory controller 1055, two or more memory buffers 1060, and a number of memory ICs 1065 for each buffer 1060. Each memory buffer 1060 includes transmit and receive circuitry 1030 to communicate with memory controller 1055. In other embodiments memory buffer 1060 may communicate with memory ICs 1065 via transmit and receive circuitry that is the same or similar to circuitry 1030.

It can be observed that in any of these embodiments which include multiple memory devices connected to a single TX/RX block that multiple coefficients may be stored and used for equalization. Each of the multiple coefficients may be tailored for the individual channels between the controller and each memory device. These coefficients can be stored in a memory, a register file or using other means. The coefficients may then be selected for use based on the memory device with which the controller is communicating.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described may be single-ended or differential, and embodiments of the invention may be adapted for use with binary or multilevel-pulse-amplitude-modulated (multi-PAM) signals.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, the invention should not be so limited. For example, 1. Receivers in accordance with the invention can incorporate a variable-gain amplifier to provide DC-offset or automatic-gain control. Such amplifiers can be configurable or can be controlled e.g. using Dlev to establish and maintain desired DC signal levels.
2. Transmitters in accordance with the invention can likewise incorporate a pre-distorted offset to provide compensation for any receiver DC-offset or automatic-gain control. Such transmitter pre-distortion can be configurable or can be controlled e.g. using Dlev mapped and scaled as appropriate for the transmitter.
3. Transmitters and receivers could use test or training patterns in lieu of live data to calibrate transmit and receive coefficients.

4. Other types of equalizers, such as passive or active continuous time analog filters or transversal filters, could be used instead of or in addition to the above-described equalizers.
5. It may be the case that other circumstances drive the desire to put equalization on one device. Cost, complexity, experience, and desire to use standard devices on one end could each be reasons to asymmetrically distribute the equalization burden.

Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A memory system supported on a printed-circuit board, the system comprising:
    a bidirectional communication lane having one or more circuit board traces;
    a memory controller integrated circuit (IC) having: a first transmitter with M filter taps and an output driver, the first transmitter to communicate first signals onto the circuit board traces of the bidirectional communication lane; and a first receiver with X filter taps, the first receiver to receive second signals from the bidirectional communication lane; and
    a memory device IC coupled to the communication lane to receive the first signals from the first transmitter, the memory IC having: a second receiver; a number of receive filter taps less than X; and a second transmitter, with a number of transmit filter taps less than M, coupled to the bidirectional communication lane to transmit the second signals to the first receiver;
    wherein the second signal is a corrupted signal that includes inter-symbol interference, and wherein the memory controller IC includes a signal monitor to provide a measure of the inter-symbol interference; and wherein the memory controller IC includes equalization control circuitry coupled between the signal monitor and the first transmitter, and wherein the equalization control circuitry adjusts at least one of the M filter taps of the first transmitter responsive to the measure of inter-symbol interference.

2. The system of claim 1, wherein the output driver of the memory controller IC has a first minimum feature size and the second receiver of the memory IC has a second minimum feature size substantially greater than the first minimum feature size.

3. The system of claim 2, further comprising a second memory device IC having a third receiver with the second minimum feature size and the number of receive filter taps less than X, wherein the third receiver is coupled to the communication lane to communicate with the first transmitter.

4. The system of claim 1, wherein the number of receive filter taps in the second receiver is zero.

5. The system of claim 1, wherein the first receiver includes at least one of the following: a decision feedback equalizer, a partial-response decision feedback equalizer, and a continuous time linear equalizer.

6. The system of claim 1, wherein the second receiver includes at least one of the following: a decision feedback equalizer, a partial-response decision feedback equalizer, and a continuous time linear equalizer.

7. The system of claim 1, wherein the number of transmit filter taps in the second transmitter is zero.

8. The system of claim 1, wherein the communication lane is a multi-drop memory bus, and wherein the memory device IC is one of a plurality of identical memory device ICs coupled to the memory bus.

9. The system of claim 1, wherein the lane includes a transmit channel and a receive channel.

10. The system of claim 1, further comprising a second bidirectional communication lane having one or more circuit board traces extending from a second output driver of a third transmitter with M filter taps on the controller IC, the third transmitter to communicate third signals onto the second bidirectional communication lane; and a second memory device IC having a third receiver with the second minimum feature size and the number of receive filter taps less than X.

11. A memory system supported on a printed-circuit board, the system comprising:
    a bidirectional communication lane having one or more circuit board traces;
    a memory controller integrated circuit (IC) having: a first transmitter with M filter taps and an output driver, the first transmitter to communicate first signals onto the circuit board traces of the bidirectional communication lane; and a first receiver with X filter taps, the first receiver to receive second signals from the bidirectional communication lane: and
    a memory device IC coupled to the communication lane to receive the first signals from the first transmitter, the memory IC having: a second receiver; a number of receive filter taps less than X; and a second transmitter, with a number of transmit filter taps less than M, coupled to the bidirectional communication lane to transmit the second signals to the first receiver;
    wherein the first receiver in the memory controller IC includes a data sampler having a first sampler terminal coupled to the communication lane and an error sampler having a second sampler terminal coupled to the communication lane, wherein the data and error samplers are to provide respective data and error samples.

12. The system of claim 11, wherein the memory controller IC further includes equalization control circuitry coupled to output terminals of the data and error samples and to at least one of the M filter taps, the equalization control circuitry to derive a tap coefficient for the at least one of the M filter taps from the data and error samples.

13. The system of claim 12, wherein the equalization control circuitry applies a sign-sign, least-mean-squared algorithm to the data and error samples to derive the tap coefficient.

14. The system of claim 11, wherein the memory controller IC further includes equalization control circuitry coupled to output terminals of the data and error samplers and to the first transmitter, the equalization control circuitry to derive a DC offset for the first signals from the data and error samples.

15. The system of claim 11, wherein the M filter taps include at least one pre-cursor tap, and wherein the equalization control circuitry derives a tap value for the pre-cursor tap from the data and edge samples.

16. The system of claim 15, wherein the equalization control circuitry includes a data filter to receive the data samples, and wherein the equalization control circuitry adjusts the tap value for the pre-cursor tap responsive to at least one specific pattern of the data samples.

17. The system of claim 16, wherein the M filter taps include at least one post-cursor tap, and wherein the equalization control circuitry holds the post-cursor tap constant while adjusting the tap value for the pre-cursor tap responsive to the at least one specific pattern of data samples.

18. A method for calibrating a communication channel extending between a memory-controller integrated circuit (IC) and a plurality of memory ICs, wherein the communication channel includes conductive traces of a printed circuit, the method comprising:
   pre-emphasizing, at the controller IC, a first signal using M transmit coefficients;
   transmitting the pre-emphasized first signal from the controller IC to one of the memory ICs over the channel;
   sampling, on the at least one of the memory IC, the pre-emphasized first signal to capture a second signal;
   transmitting the second signal from the one memory IC back to the controller IC;
   equalizing, at the controller IC, the second signal using X receive coefficients;
   sampling, at the controller IC, the equalized second signal to capture a corrupted signal, wherein the corrupted signal includes inter-symbol interference;
   measuring, at the controller IC, the inter-symbol interference from the sampled corrupted signal;
   updating, at the controller IC, at least one of the M transmit coefficients using the measured inter-symbol interference; and
   pre-emphasizing, at the controller IC, the first signal using the updated transmit coefficient.

19. The method of claim 18, further comprising equalizing the pre-emphasized first signal at the memory IC, prior to the sampling of the pre-emphasized for signal, using a second number of receive coefficients less than X.

20. The method of claim 19, further comprising pre-emphasizing the second signal at the memory IC, prior to the transmitting from the one memory IC, using a second number of transmit coefficients less than M.

21. The method of claim 18, wherein the controller IC has a first minimum feature size and the memory ICs have a second minimum feature size substantially greater than the first minimum feature size.

22. The method of claim 18, further comprising measuring an amplitude of the second signal at the controller IC, and wherein the updating of the M transmit coefficients is based at least in part on the amplitude.

23. The method of claim 18, further comprising adjusting, at the controller IC, an amplitude of the first signal based upon the measured inter-symbol interference.

24. The method of claim 18, further comprising adjusting, at the controller IC, a voltage offset of the first signal based upon the measured inter-symbol interference.

25. The method of claim 18, wherein the M transmit coefficients include at least one pre-cursor coefficient.

26. The method of claim 25, wherein the measuring the inter-symbol interference from the sampled data includes adjusting at least one of the X receive coefficients responsive to at least one specific pattern of the samples of the corrupted signal.

27. The method of claim 26, wherein the M transmit coefficients include at least one pre-cursor coefficient and the X receive coefficients include at least one post-cursor coefficient, and wherein the equalization control circuitry holds the post-cursor coefficient constant while adjusting the pre-cursor coefficient.

28. A memory system, comprising:
   a memory controller;
   a memory device;
   one or more conductive paths extending between the memory controller and the memory device and exhibiting low-pass filter characteristics;
   where
      the memory controller performs transmit equalization on first signals, the first signals to be transmitted from the memory controller to the memory device over one of the paths, such that transmitted signals to the memory device exhibit deemphasized low-frequency signal components relative to high-frequency signal components,
      the memory controller performs receive equalization on second signals received from the memory device over one of the conductive paths to deemphasize low frequency signal components relative to high-frequency signal components, and
      the first signals as transmitted exhibit greater low frequency de-emphasis relative to high frequency signal components than the second signals as transmitted.

29. The memory system of claim 28, where the one or more conductive paths include a bidirectional conductive path, each of the first signals and the second signals being transmitted on the bidirectional conductive path in opposite directions.

30. The memory system of claim 29, where the bidirectional conductive path includes a printed circuit board trace.

31. The memory system of claim 28, where the memory controller includes a transmitter to communicate the first signals to the memory device and a receiver to receive the second signals from the memory device, and where the memory controller further includes equalizer circuitry to equalize an output of the transmitter and an input of the receiver, respectively, each via one or more filter taps driven in response to data values.

32. The memory system of claim 28, where the memory controller determines weights for the one or more filter taps based on channel calibration in a first direction, and applies the weights to equalize each of the first signals and the second signals.

33. The memory system of claim 32 where the one or more conductive paths include a bidirectional conductive path, each of the first signals and the second signals being transmitted on the bidirectional conductive path in opposite directions, with the weights applied to equalize bidirectional communications occurring on the conductive path.

34. The memory system of claim 28, where the one or more conductive paths exhibit characteristics of a simple low pass filter.

35. The memory system of claim 28, where the memory device is a dynamic random access memory (DRAM) integrated circuit.

36. The memory system of claim 35, where the DRAM integrated circuit includes a signal pad to receive the first signals and a signal pad to transmit the second signals, the signal pad transmitting the second signals exhibiting substantial noise during transmission of the second signals relative to the signal pad that receives the first signals during receipt of the first signals.

37. The memory system of claim 36, where the signal pad to receive the first signals and the signal pad to transmit the second signals are the same signal pad.

38. The memory system of claim 36, where the signal pad to receive the first signals exhibits at least thirty percent greater signal to interference ratio relative to the signal pad to transmit the second signals.

39. The memory system of claim 28, where the memory controller includes a signal pad to transmit the first signals and a signal pad to receive the second signals, the signal pad receiving the second signals exhibiting substantial noise during receipt of the second signals relative to the signal pad that transmits the first signals during transmission of the first signals.

40. The memory system of claim 28, further comprising plural of said memory devices, where the one or more conductive paths are configured as a bidirectional, multi-drop bus.

41. The memory system of claim 40, where the memory controller includes a storage block to store equalizer coefficients for each of the plural memory devices, and where the controller selects the coefficients for equalization in dependence upon a particular memory device the controller is communicating with.

42. The memory system of claim 28, where the memory device includes a simple binary receiver and a simple binary transmitter.

43. The memory system of claim 42, where the simple binary receiver includes a preamplifier and a sampler and lacks an equalizer.

44. In a memory system having a memory controller, at least one memory device, and at least one conductive path connecting the memory controller and the at least one memory device, where each conductive path exhibits low-pass filter characteristics, a controller-implemented method, comprising:
    performing transmit equalization on first signals, the first signals to be transmitted from the memory controller to the memory device over one of the paths, such that transmitted signals to the memory device exhibit deemphasized low-frequency signal components of the transmitted signals relative to high-frequency signal components of the transmitted signals; and
    performing receive equalization on second signals received from the memory device over one of the conductive paths to deemphasize low frequency signal components of the second signals relative to high-frequency signal components of the second signals;
    where the first signals as transmitted on the one or more conductive paths exhibit greater low frequency deemphasis relative to high frequency signal components than the second signals as transmitted on the one or more conductive paths.

45. The method of claim 44, where the one or more conductive paths include a bidirectional conductive path, the method further comprising transmitting the first signals and the second signals in opposite directions on the bidirectional conductive path.

46. The method of claim 45, further comprising performing a channel calibration in a first direction on the bidirectional conductive path to determine weights for one or more filter taps and applying the weights to equalize each of the first signals and the second signals.

47. The method of claim 44, where the memory device includes a DRAM integrated circuit having a signal pad to receive the first signals and a signal pad to transmit the second signals, the method performed such that the signal pad transmitting the second signals exhibits substantial noise during transmission of the second signals relative to the signal pad that receives the first signals during receipt of the first signals.

48. The method of claim 47, where the signal pad to receive the first signals and the signal pad to transmit the second signals are the same signal pad, and where the method is performed such that the signal pad to receive the first signals exhibits at least thirty percent greater signal to interference ratio relative to the signal pad to transmit the second signals.

49. The method of claim 44, where the memory controller includes a signal pad to transmit the first signals and a signal pad to receive the second signals, the method performed such that the signal pad receiving the second signals exhibits substantial noise during receipt of the second signals relative to the signal pad that transmits the first signals during transmission of the first signals.

50. The method of claim 44, where the memory system further comprises a plurality of said memory devices, and where the one or more conductive paths are configured as a bidirectional, multi-drop bus, the method further comprising storing coefficients specific to each of the plural memory devices, determining a particular memory device the controller is communicating with, and retrieving associated coefficients to equalize at least one of the first signals or the second signals.

51. The method of claim 44, where the memory device includes a simple binary receiver and a simple binary transmitter, the method including performing equalization for each of the first signals and the second signals substantially only at the memory controller, such that the first signals are transmitted to have attenuated low frequency components relative to high frequency components, and the second signals are transmitted by the memory device to not have attenuated low frequency components relative to high frequency components.

* * * * *